(12) United States Patent
Kotaki et al.

(10) Patent No.: US 9,082,585 B2
(45) Date of Patent: Jul. 14, 2015

(54) DEFECT OBSERVATION METHOD AND DEVICE USING SEM

(75) Inventors: Go Kotaki, Kumamoto (JP); Atsushi Miyamoto, Yokohama (JP); Ryo Nakagaki, Kawasaki (JP); Takehiro Hirai, Ushiku (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 550 days.

(21) Appl. No.: 13/143,345

(22) PCT Filed: Nov. 27, 2009

(86) PCT No.: PCT/JP2009/070364
§ 371 (c)(1),
(2), (4) Date: Aug. 4, 2011

(87) PCT Pub. No.: WO2010/079657
PCT Pub. Date: Jul. 15, 2010

(65) Prior Publication Data
US 2011/0285839 A1 Nov. 24, 2011

(30) Foreign Application Priority Data
Jan. 9, 2009 (JP) .................................. 2009-003039

(51) Int. Cl.
*H04N 7/18* (2006.01)
*H01J 37/22* (2006.01)
*G06T 7/00* (2006.01)
*H01J 37/26* (2006.01)
*H01J 37/28* (2006.01)
*H01L 21/66* (2006.01)

(52) U.S. Cl.
CPC ............... *H01J 37/222* (2013.01); *G06T 7/001* (2013.01); *H01J 37/265* (2013.01); *H01J 37/28* (2013.01); *G06T 2207/10061* (2013.01); *G06T 2207/30148* (2013.01); *H01J 2237/2817* (2013.01); *H01L 22/12* (2013.01)

(58) Field of Classification Search
CPC ....................................................... G06T 7/001
USPC ..................................................... 348/79–80
See application file for complete search history.

(56) References Cited

U.S. PATENT DOCUMENTS

| 6,476,388 | B1* | 11/2002 | Nakagaki et al. ................. 850/9 |
| 2001/0042705 | A1 | 11/2001 | Nakagaki et al. |
| 2006/0038986 | A1 | 2/2006 | Honda et al. |
| 2006/0215901 | A1* | 9/2006 | Nakagaki et al. ............. 382/149 |

(Continued)

FOREIGN PATENT DOCUMENTS

| JP | 2001-189358 | 7/2001 |
| JP | 2001-331784 | 11/2001 |
| JP | 2003-098114 | 4/2003 |

(Continued)

*Primary Examiner* — Christopher S Kelley
*Assistant Examiner* — Jonathan Messmore
(74) *Attorney, Agent, or Firm* — Baker Botts L.L.P.

(57) ABSTRACT

An imaging region of a high-magnification reference image capable of being acquired in a low-magnification field without moving a stage from a position at which a defective region has been imaged at a low magnification is searched for and if the search is successful, an image of the imaging region itself is acquired and the high-magnification reference image is acquired. If the search is unsuccessful, the imaging scheme is switched to that in which the high-magnification reference image is acquired from a chip adjacent to the defective region.

8 Claims, 9 Drawing Sheets

(56) References Cited

U.S. PATENT DOCUMENTS

2008/0067371 A1 3/2008 Kurihara et al.
2010/0128970 A1 5/2010 Nakagaki et al.

FOREIGN PATENT DOCUMENTS

| JP | 2006-269489 | 10/2006 |
| JP | 3893825 | 12/2006 |
| JP | 2007-305760 | 11/2007 |

* cited by examiner

DEFECT OBSERVATION METHOD AND DEVICE USING SEM

TECHNICAL FIELD

The present invention relates generally to defect-reviewing apparatuses for reviewing various defects likely to occur during semiconductor wafer-manufacturing processes, and classifying the reviewed defects. More particularly, the invention is directed to a defect-reviewing apparatus having a function that rapidly automatically acquires an image of a particular defective region and an image of its nondefective equivalent. The invention is also directed to a defect-reviewing method using the apparatus.

BACKGROUND ART

The microstructuring of the circuit patterns formed on semiconductor wafers is increasingly progressing. As the circuit patterns become more microstructured, the effects that the defects occurring during the manufacturing processes for these semiconductor wafers will cause to a product yield are also coming to be more significant. It is increasingly important, therefore, to control the processes so as to prevent such defects from occurring during the manufacturing phase.

At semiconductor wafer-manufacturing sites, defect inspection apparatuses and defect-reviewing apparatuses are currently being used as a typical preventive measure against decreases in yield. These defect inspection apparatuses rapidly examine at what positions on the wafer a defect is present. A state of the wafer surface is imaged using optical means or electron beams, and the image is processed automatically to examine whether defects exist. In defect inspection apparatuses, because of their rapidness being important, the volume of image data is reduced by maximizing a pixel size of images to be acquired (i.e., by minimizing resolution). In a majority of cases, there is a problem in that even when the presence itself of a defect can be confirmed from a detected image of low resolution, the kind of defect which has been detected cannot be discriminated.

Defect-reviewing apparatuses are used to acquire at a reduced pixel size (i.e., at high resolution) an image of each defect detected by a defect inspection apparatus, and classify the defects. At present, defect-reviewing apparatuses for manual or computer-aided automatic image acquisition and defect classification are placed on the market by various manufacturers. The resolution of the images required for classification sufficiently high in accuracy is determined by sizes of the defects to undergo processing in the defect-reviewing apparatuses. In the manufacturing processes for the increasingly microstructured semiconductor wafers, some of the defect sizes reach the order of several tens of nanometers, so the defect-reviewing apparatuses using a scanning electron microscope (SEM) capable of enlarging pixel sizes to several nanometers are coming to be commonly used.

JP-A-2001-331784 (Patent Document 1) discloses an apparatus configuration and apparatus functions of a scanning electron microscope used for reviewing defects at a semiconductor production site (hereinafter, this microscope is referred to simply as the reviewing SEM). Patent Document 1 also describes an automatic defect reviewing (ADR) technique and an automatic defect classification (ADC) technique. The ADR technique relates to supplying the defect coordinate data obtained from a defect inspection apparatus, as well as the wafer, to the reviewing SEM, and thus automatically acquiring a defect image that is an image including various defects in a field of view, and a reference image that is an image of a nondefective pattern not including any defects in a field of view in a region having the same pattern as that of the defect image. The ADC technique relates to classifying defects using the two images.

Japanese Patent No. 3893825 (Patent Document 2) discloses a method for acquiring defect images and reference images through the ADR process. More specifically, comparisons are first conducted between a defect image formed by imaging the defective region at a low magnification (this image is hereinafter referred to as the low-magnification defect image), and a reference image formed by low-magnification imaging of the region in which a nondefective pattern of the defective region is formed (this image is hereinafter referred to as the low-magnification reference image). Next, a difference between the two images is detected as a defect. Finally, a defect image formed by imaging the detection position at a high magnification, and a reference image formed by imaging the detection position at a high magnification are acquired (the defect image is hereinafter referred to as the high-magnification defect image, and the reference image as the high-magnification reference image). The same chip is usually disposed in plurality on a semiconductor wafer. An image obtained by imaging a location that is one chip of space apart from a coordinate position at which a defect exists, therefore, is commonly used as a reference image.

During the ADC process, the high-magnification defect image and high-magnification reference image obtained from the ADR process (the two images are composed of a secondary-electron image and a reflected-electron image) are used to divide defects into a plurality of categories using several criteria. More specifically, defect classification uses several criteria. For example, a shape of the defect existing in the high-magnification defect image is examined, then a surface roughness level of the defect is examined or at what position the defect is present with respect to the circuit pattern existing behind it (e.g., whether the defect lies across an electrical interconnect, exists on one interconnect, or is present in a region free of an interconnect) is examined, and a criticality level of the defect is determined.

Technical problems associated with the reviewing SEM relate to obtaining high throughput in the ADR process for automatic acquisition of a defect image and a reference image, and to obtaining high accuracy in the ADC process for the classification of acquired defect images.

With reference to how to enhance ADR throughput, JP-A-2003-98114 (Patent Document 3) describes a technique for estimating reference images using information on periodicity of a background circuit pattern of a defect estimated from a defect image (hereinafter, this technique is referred to as the reference image combining scheme). In addition, JP-A-2006-269489 (Patent Document 4) describes a technique for acquiring high-magnification reference images by digitally zooming up low-magnification reference images (hereinafter, this technique is referred to as the digital zooming scheme). These techniques allow an image equivalent to a reference image to be acquired without using the reference image, and thus allow an ADR process time to be significantly reduced.

With reference to how to enhance ADC accuracy, it is important to acquire a high-magnification reference image having high resolution, for the following reason: in the ADC process, the high-magnification reference image is used for a defect region extraction process based on comparison with a high-magnification defect image, and for a defect criticality determination process in which to determine the criticality level of the defect by a relationship between the defect position and a circuit pattern position extracted from the high-magnification reference image, and results of the two processes affect classifying performance of ADC.

DISCLOSURE OF THE INVENTION

Problems to be Solved by the Invention

However, while the ADR processes involving no reference imaging, disclosed in Patent Documents 3 and 4, can be enhanced in throughput, these ADR processes do not allow for the acquisition of a high-magnification reference image having high resolution. The digital zooming scheme disclosed in Patent Document 3 has a problem in that since a wider low-magnification imaging field and a narrower high-magnification imaging field are used to create a higher-magnification reference image from a lower-magnification reference image, an increase in the enlarging magnification of the lower-magnification reference image tends to blur the higher-magnification reference image. That is to say, this latter reference image tends to decrease in resolution.

Additionally, the reference image composite scheme disclosed in Patent Document 4 has a problem in that because a nondefective pattern corresponding to a defective region is estimated from a neighboring pattern, a composite reference image is slightly departing from a true nondefective pattern.

Furthermore, the scheme disclosed in Patent Document 2 for acquiring a high-magnification reference image by imaging a position that is one chip of space apart from a high-magnification defect imaging position has a problem in that although the decrease in image resolution and the departure from the true nondefective pattern are avoidable, throughput tends to decrease since moving the field of view between chips generally involves stage moving.

The present invention is intended to provide a defect-reviewing apparatus (reviewing SEM) that enables, in order to solve the above problems, rapid acquisition of high-magnification reference images, without stage movement as well as a decrease in image resolution, targeted for defects in a semiconductor wafer or the like. The invention is also intended to provide a defect-reviewing method using the apparatus.

Means for Solving the Problems

To solve the above problems, an aspect of the present invention provides a method and apparatus using a scanning electron microscope (SEM) to closely review a defective region on a sample, and a region having formed thereon a nondefective pattern of the defective region, the method including the steps of: acquiring a low-magnification defect image by imaging an approximate defect position at a low magnification, wherein the approximate defect position is an input position defined as either a defect coordinate position obtained during wafer defect inspection with optical means or electron beams, or coordinate positions of problematic sections most likely to become defective during semiconductor manufacturing; identifying a defect-containing high-magnification defect imaging region by the low-magnification defect image; acquiring a high-magnification defect image by imaging the high-magnification defect imaging region at a high magnification; searching for, within a zone in which an image can be acquired without stage movement from the approximate defect position to which a field of view has been moved during the acquisition of the low-magnification defect image, a high-magnification reference imaging region having a section at which a nondefective pattern of an image of the high-magnification defect imaging region is formed; and acquiring an image of the high-magnification reference imaging region (hereinafter, this image is referred to as a neighboring high-magnification reference image). The present invention, therefore, enables acquisition of high-magnification reference images without stage movement, and reduction of a processing time required for the acquisition of the high-magnification reference images.

In addition, since the high-magnification defect imaging region or its neighboring region is likely to be laden with contamination (contaminants sticking to the surface of the sample) due to electron beam irradiation, the high-magnification reference imaging region is searched for in the neighboring high-magnification reference imaging region searching step so that the high-magnification reference imaging region does not overlap the high-magnification defect imaging region or its peripheral region.

Furthermore, in the step of searching for the neighboring high-magnification reference imaging region according to the present invention, a searching defect image formed by imaging a region that lies in a zone capable of being imaged without stage movement is acquired and the searching template is used to search for the high-magnification reference imaging region from the searching low-magnification defect image.

Moreover, in the step of searching for the neighboring high-magnification reference imaging region according to the present invention, a searching defect image formed by imaging a region that lies in a zone capable of being imaged at an essentially distortion-free high image quality level as well as without stage movement is acquired and the searching template is used to search for the high-magnification reference imaging region from the searching low-magnification defect image.

Besides, the present invention can also be applied in a mode that involves no low-magnification reference imaging. This mode is hereinafter referred to as the low-magnification reference imaging-less mode. The high-magnification reference imaging region searching step in the low-magnification reference imaging-less mode according to the present invention includes: an estimated low-magnification reference image generating sub-step for generating an estimated low-magnification reference image that is a low-magnification reference image estimated to have a section at which a nondefective pattern of a low-magnification defect image is formed; an estimated high-magnification reference imaging region determining sub-step for determining a high-magnification reference imaging region from the estimated low-magnification reference image; and a neighboring high-magnification reference imaging region searching sub-step for searching for the high-magnification reference imaging region from the low-magnification defect image, in the sub-step of which, the search uses an image of the estimated high-magnification reference imaging region, wherein cyclic periodicity of a pattern can be used to estimate the low-magnification reference image from the low-magnification defect image.

The present invention can be applied to conventional sequences such as a low-magnification reference imaging mode, low-magnification reference imaging-less mode, and high-magnification reference image estimation mode, and if a determination result on whether the neighboring high-magnification reference imaging region search has been successful indicates that the sequence of the invention has failed, the sequence can be switched to a conventional one. In addition, the invention is not limited to the above modes; a high-magnification reference image, as well as a low-magnification defect image and a low-magnification reference image (based on imaging or estimation), can be acquired during high-magnification reference imaging when the neighboring high-magnification reference imaging region searching step in the invention is executed using a position of the stage as an input.

Effects of the Invention

According to the present invention, a defect-reviewing apparatus targeted for semiconductor wafer surface defects detected during inspection with an external inspection apparatus achieves high-throughput high-accuracy automatic defect classification. Even more highly accurate classification of a larger number of defects is therefore realized with the same processing time as that required in conventional technology. Consequently, the invention is expected to improve problematic-process identification accuracy during the manufacture of semiconductors, and hence, a semiconductor-manufacturing yield.

DESCRIPTION OF THE REFERENCE NUMERALS

101 Electron source
102 Accelerating electrode
103 Focusing lens
104 Deflector
105 Objective lens
106 Sample
107 Stage
108 Primary electron
109 Secondary electron
110 Secondary electron detector
111 A/D converter
112 Total control unit
113 Image-processing unit
116 Recipe storage unit
117 Input/output unit
120 Bus
121 Reflected electron detector

BEST MODE FOR CARRYING OUT THE INVENTION

Hereunder, the best mode for carrying out the present invention will be described with reference to the accompanying drawings.

First Embodiment

A first embodiment of an ADR process and ADC process using a defect-reviewing apparatus according to the present invention is described below. In the first embodiment, an acquired low-magnification reference image is used to acquire a high-magnification reference image without stage movement from a low-magnification defect imaging position.

Figure 1:
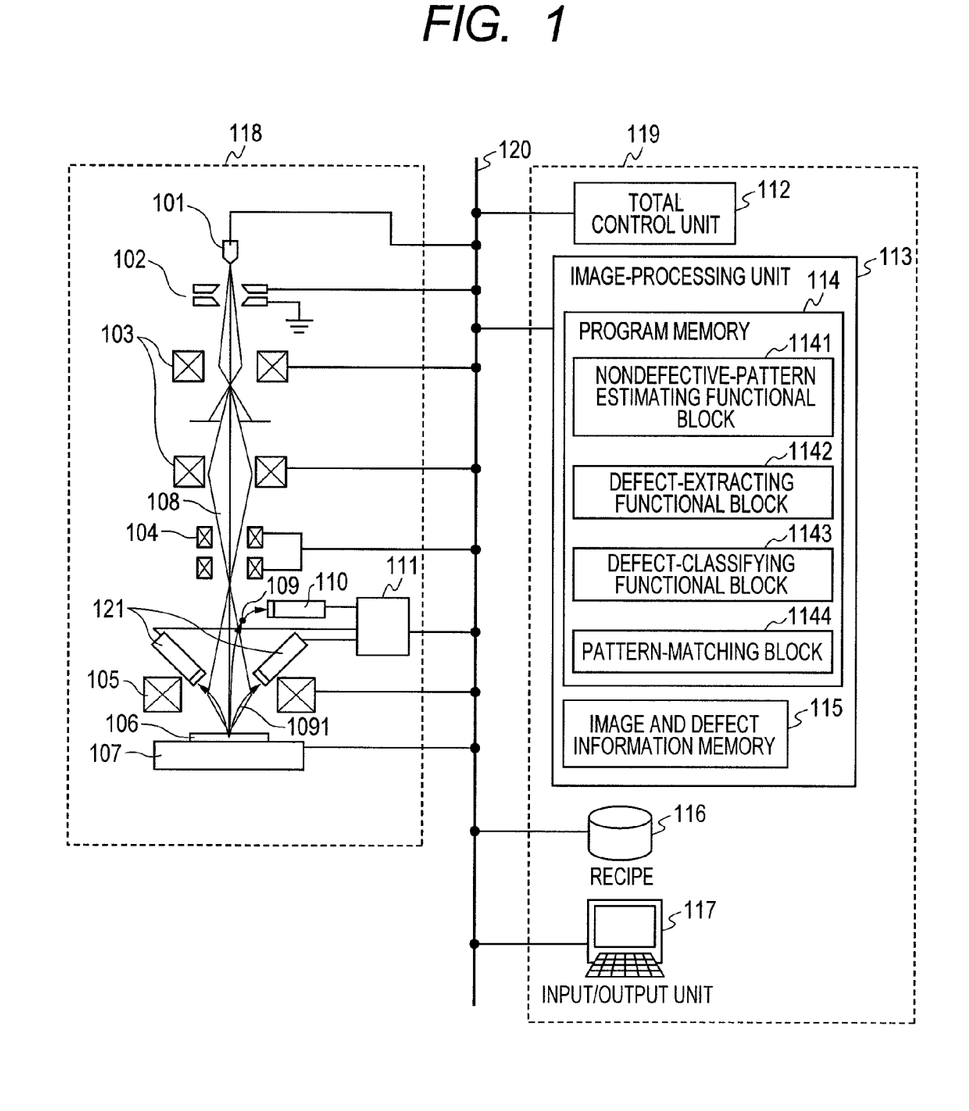
FIG. 1 is a block diagram of an apparatus pertaining to the present invention.

First, an apparatus configuration of a reviewing SEM according to the present invention, that is, a defect-reviewing apparatus using a scanning electron microscope, is described below with reference to FIG. 1. The reviewing SEM apparatus according to the invention includes a SEM image acquisition unit 118 and a signal-processing unit 119, both of which are interconnected by a bus 120. The SEM image acquisition unit 118 itself includes an electron source 101 for generating a primary electron 108, an accelerating electrode 102 for accelerating the primary electron, a focusing lens 103 for converging the primary electron, a deflector 104 for deflecting the primary electron for two-dimensional scanning, and an objective lens 105 for converging the primary electron upon a wafer 106 which is a sample to be reviewed. Reference number 107 denotes a stage on which to mount the sample, the stage being movable in an XY plane. Reference number 110 denotes a detector that detects a secondary electron 109 generated from the sample. Reference number 121 denotes a detector that detects a reflected primary electron which is reflected from a surface of the sample, and 111 denotes an analog-to-digital (A/D) converter that converts the detected signal into digital form. The constituent elements of the SEM image acquisition unit 118 are each connected to a total control unit 112 through the bus 120.

The signal-processing unit 119 includes an image-processing unit 113, a storage unit 116, and an input/output unit 117, as well as the total control unit 112. The image-processing unit 113 includes a program memory 114 that processes acquired images and classifies defects, and an image memory 115 for storage of the acquired images, defect information, and more. Reviewing-parameter information (recipe information) that includes coordinate information obtained during inspection with the defect inspection apparatus, and design information of an inspection object chip that has been acquired via the bus 120 from a data server not shown are stored into the storage unit 116. In addition to devices such as a keyboard and mouse for giving instructions to the apparatus, the input/output unit 117 includes a monitor and printer for data output from the apparatus. The total control unit 112, the image-processing unit 113, the storage unit 116, and the input/output unit 117 are interconnected via the bus 120.

During SEM-aided image acquisition, the primary electron 108 that is emitted from the electron source 101 is accelerated by the accelerating electrode 102, then converged by the focusing lens 103, and further converged by the objective lens 105, and irradiated on a section of the wafer 106. During this sequence, the deflector 104 deflects the primary electron beam such that the primary electron is two-dimensionally scanned over a field of view on the wafer 106 that is determined by a magnification registered in the recipe. The secondary electron 109 and reflected electron 1091 that are generated from the surface of the sample by the irradiation of the primary electron beam 108 are captured by the secondary electron detector 110 and the reflected-electron detector 121, respectively. The captured electrons, after being converted into optical signal form by a scintillator (not shown), are converted into electrical signals by a photomultiplier tube (not shown) first and then into digital signals by the digitizer 111. The thus-obtained digital signal data is stored as a digital image into the image memory 115. In a scanning electron microscope, since a great deal of shot noise such as a secondary electron emanated from the sample when scanning a primary electron beam on the sample, an image of a sufficiently high S/N ratio usually cannot be obtained just by the scanning over the same area one time. For this reason, primary electron beam scanning and digital data acquisition are usually repeated the number of scans (frames) specified in the recipe, and an averaged image based on these scans is later derived to generate image data.

The description here assumes that the wafer 106 is already mounted on the stage 107 before the ADR process and the ADC process are started. The description also assumes that position information relating to each defect on the wafer 106, the position information being obtained during the inspection of the wafer 106 with the defect inspection apparatus (not shown), and a variety of electronic optical parameters (e.g., an accelerating voltage, probe current, and imaging magnification) for imaging the wafer 106 with the SEM image acquisition unit 118 are already stored in a recipe file of the storage unit 116. During this sequence, two types of imaging magnifications, namely, low magnifications (say, nearly 10,000 times) and high magnifications (say, nearly 200,000 to 300,000 times at a maximum, depending on the defect size), are usually set in the recipe file of the storage unit 116. This is because, although an imaging magnification from 50,000 times to about 300,000 needs to be set to classify very small defects to be observed during semiconductor-manufacturing processes, the imaging field of view is assumed to become narrowed under such conditions and thus if the inspection apparatus is too low in detection accuracy, defective regions are likely not to come into view of the defect-reviewing apparatus (reviewing SEM).

Image acquisition, or the ADR process, is therefore conducted in two steps. A first step is to obtain a wide-field image by imaging at a low magnification and extract a defect position from the image field, and a second step is to image the extracted defect position at a high magnification. An operator of the SEM uses the input/output unit 117 to display a plurality of recipes registered in the storage unit 116, on the monitor of the input/output unit 117, and then select a measuring recipe from these displayed recipes on the monitor. At this time, the SEM operator can optionally modify any parameters of the selected recipe. After this, the total control unit 112 gives instructions for the ADR process and the ADC process to be conducted in accordance with the processing conditions stored in the selected recipe.

Figure 2:
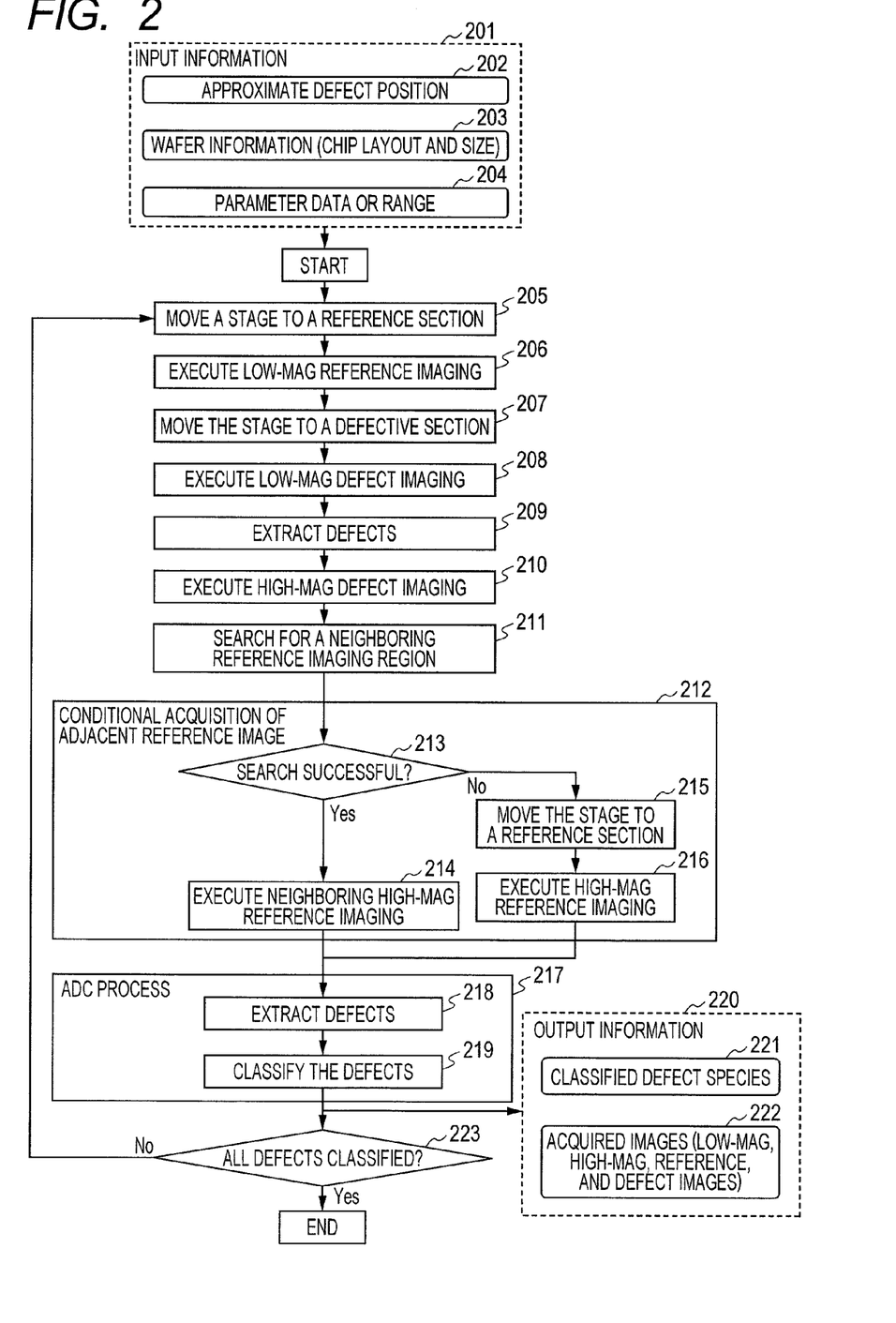
FIG. 2 is a process flow diagram that shows a first embodiment of an ADR process and ADC process using a defect-reviewing apparatus according to the present invention.
Figure 3:
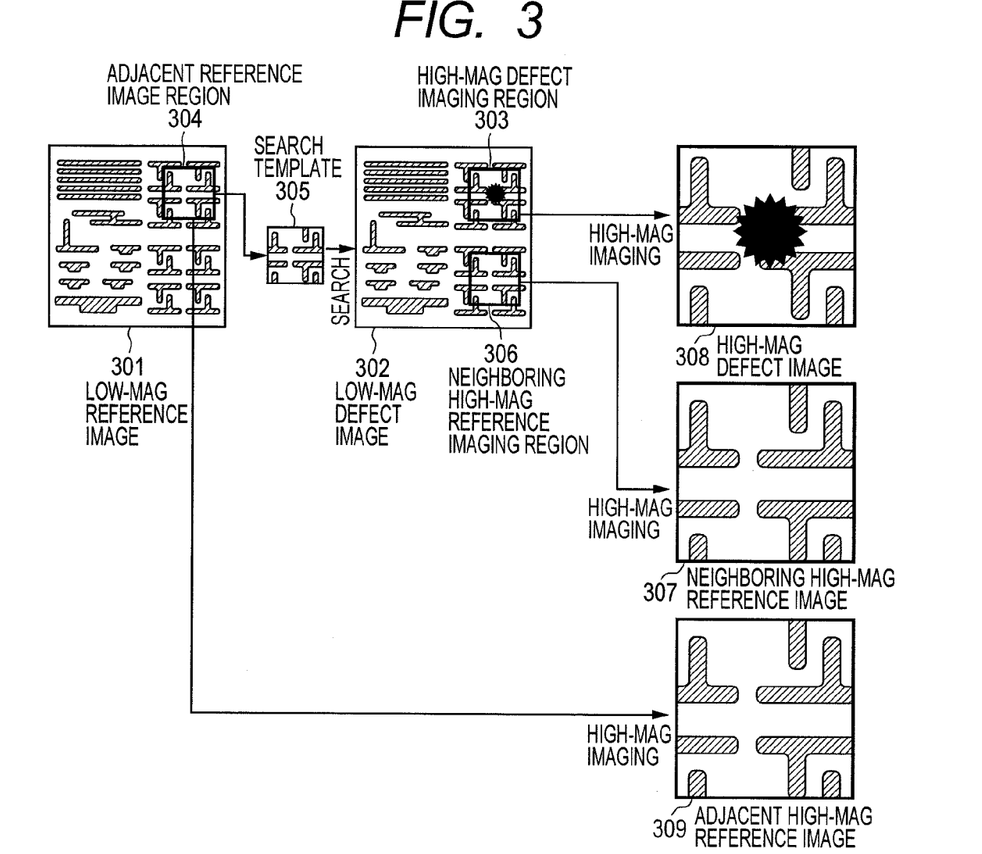
FIG. 3 is an illustrative diagram of the first embodiment of the ADR process and ADC process in the present invention.

After the recipe as well as the wafer to undergo the ADR and ADC processes has been set by the above procedures, the ADR and ADC processes are conducted in accordance with the sequence shown in FIG. 2. FIG. 3 schematically shows examples of defect images and reference images obtained in the sequence. In the defect images and reference images shown in the figure, grand areas are shown as white areas and interconnect patterns are shown as hatched areas.

Next concerning the ADR and ADC processes according to the present invention, the sequence of the present invention is described below with reference to FIGS. 2 and 3. Input information 201 necessary for the ADR and ADC processes is first entered. The input information 201 includes: approximate defect position information 202 that includes either the on-wafer defect coordinate information obtained from a wafer inspection by using a defect inspection apparatus (not shown) that uses the optical means or the SEM, or coordinate information on a number of chips formed on the wafer, or coordinate information on risky sections which are most likely to become defective during semiconductor manufacturing; wafer information 203 that includes design information such as, information on the layout of the chips on the wafer to be processed, on sizes of the chips, layout information on circuit patterns formed in the chips, and more; and information 204 on the ADR and ADC process parameters, on low-magnification or high-magnification imaging fields of view, and on other factors.

Next, the total control unit 112 controls to move the stage 107 in step 205 so that, in accordance with the defect position information stored in the recipe file of the storage unit 116 for the ADR and ADC processes, a nondefective reference pattern will come into a field of view of the SEM. The apparatus acquires a low-magnification reference image 301 by imaging at a low magnification in step 206. The reference pattern refers to a region in which the same circuit pattern as that of a defective section is formed and no defects are present. In a semiconductor wafer on which a large number of chips having the same patterns are formed in array, if a region on a neighboring chip that is the same with internal relative coordinates of defective sections in a object chip is imaged, the imaged region can be used as the reference pattern.

Next, the stage 107 is further moved on the basis of the stored defect position information in the recipe file of the storage unit 116 so that a target defect on the wafer 106 comes into an imaging field of view (step 207) of the SEM, and then a low-magnification defect image 302 is acquired by low-magnification imaging (step 208). Differential comparisons between the low-magnification defect image 302 and the low-magnification reference image 301 are next conducted in accordance with a defect extraction program stored in a defect-extracting functional block 1142 of the program memory 114, and the defect position is extracted (step 209).

Next, a high-magnification defect imaging region 303 with the extracted defect position as its center is imaged and a high-magnification defect image 308 is acquired (step 210). The region having the same in-chip coordinates as those of the high-magnification defect imaging region 303 is acquired as an adjacent reference image region 304 with respect to the low-magnification reference image 301, and then an image of the adjacent reference image region 304 is extracted and stored into the image memory 115. The extracted image is next used as a searching template 305, then a pattern-matching program stored in a pattern-matching block 1144 of the program memory 114 is executed with the searching template 305 and low-magnification defect image 302 as inputs, and a neighboring high-magnification reference imaging region 306 having the pattern most similar to that of the searching template 305 in the low-magnification defect image 302 is searched for (step 211).

Figure 4:
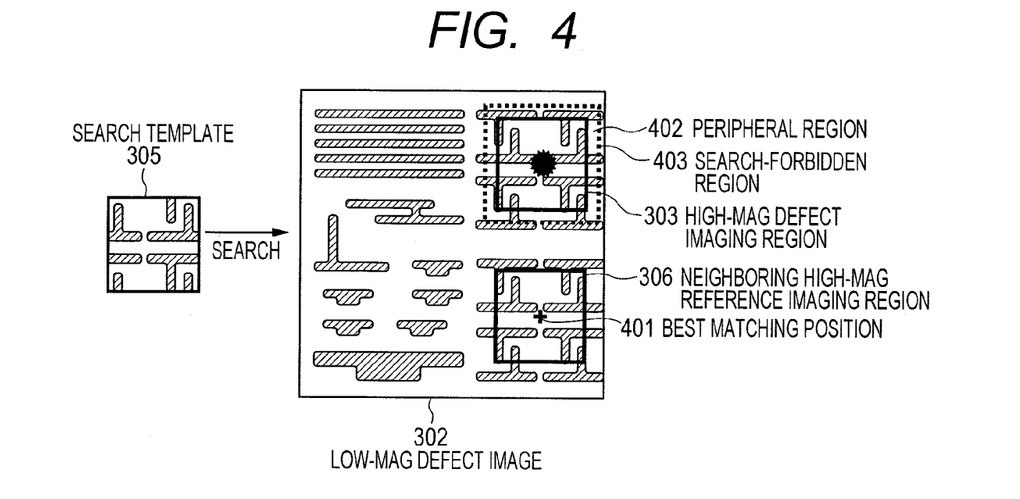
FIG. 4 is an illustrative diagram showing an example in which a region useable for high-magnification reference image is searched for from a low-magnification defect image in the present invention.

FIG. 4 schematically represents a way of the search using a pattern-matching program 1144 stored in the pattern-matching block 1144.

The pattern-matching program 1144 stored in the pattern-matching block 1144 uses normalization correlation matching or any other general pattern-matching method to calculate the best matching position 401 at which the image of the searching template 305 is most similar to the low-magnification defect image 302, and a matching score obtained by digitizing the similarity at that position. A general pattern-matching method such as normalization correlation pattern matching can be used to calculate the matching score. At this time, since the high-magnification defect imaging region 303 included in the low-magnification defect image 302 generally has a pattern similar to that of the searching template 305, the high-magnification defect imaging region 303 is likely to be detected as the best matching position.

Imaging this position, however, results in imaging of the same section as the high-magnification defect imaging region 303, and thus does not enable acquisition of a desired high-magnification reference image free of defective regions. Additionally, the high-magnification defect imaging region 303 or its neighboring region 403 is likely to be caused an incidence of contamination (contaminants adhering to the surface of the sample) due to electron beam irradiation. Since contamination adhered sections in the neighboring high-magnification reference imaging region are not selected as area for detecting neighboring high-magnification reference images, the high-magnification defect imaging region 303 or the neighboring region 403 is recognized as a search-forbidden region, and the neighboring high-magnification reference imaging region 306 is searched for, exclusive of any regions overlapping the search-forbidden region.

Figure 7:
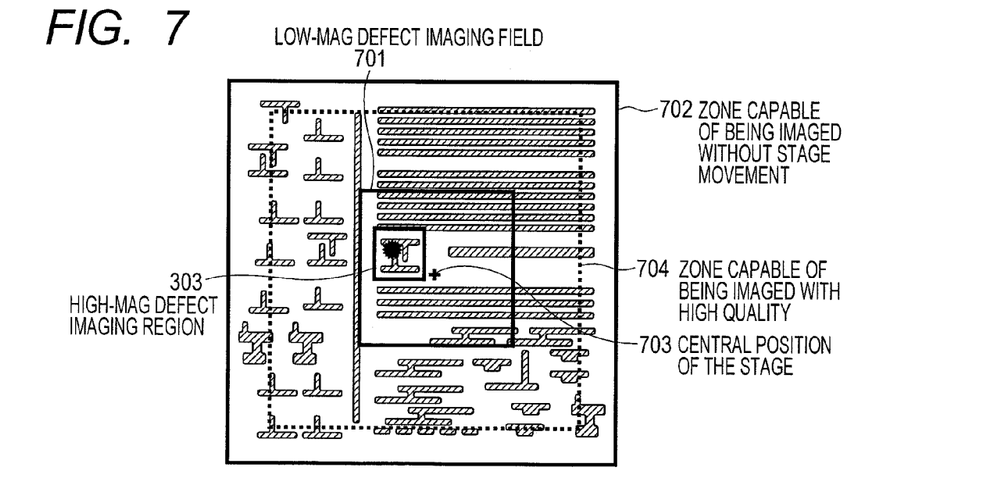
FIG. 7 is an illustrative diagram of a search zone for a neighboring high-magnification reference imaging region in the present invention.

In addition, the neighboring high-magnification imaging region 306 to be searched for is not limited to a low-magnification defect imaging field 701 as shown in FIG. 7. The search can also be conducted from a zone 702 capable of being imaged without stage movement. In this case, a searching defect image is acquired by imaging the zone 702 capable of being imaged without stage movement, and then the neighboring high-magnification imaging region 306 is searched from the acquired searching defect image. However, since distortion of the acquired image may occur with an increase in distance from a central coordinate position 703 of the stage, a high-quality imaging zone 704 in which the image can be formed at a high quality level without causing such distortion can be specified so as to enable the neighboring high-magnification reference imaging region 306 to be searched by acquiring the searching defect image. The high-quality imaging zone 704 is likely to be included in the low-magnification defect imaging field 701. If this is the case, the search for the neighboring high-magnification reference imaging region 306 is conducted in the high-quality imaging zone 704, from the low-magnification defect image 302.

Next, the image-processing unit 113 conducts conditional adjacent reference image acquisition 212. During the conditional adjacent reference image acquisition 212, whether a pattern similar to that of the searching template image is present in the low-magnification defect image is determined using a predetermined threshold level corresponding to the best matching score (step 213). If the pattern is determined to be present, the neighboring high-magnification reference imaging region 306 centering on the best matching position is imaged and a neighboring high-magnification reference image 307 is acquired (step 214). Conversely if the pattern is determined to be absent, processing similar to a conventional high-magnification reference imaging sequence is conducted. That is, the stage is moved to an imaging position of the low-magnification reference image 301 (step 215) and then the adjacent reference image region 304 is imaged to acquire its high-magnification reference image (step 216).

In this way, if in step 213, the pattern resembling that of the searching template image obtained in step 211 of searching for the neighboring reference imaging region is determined to be absent in the low-magnification defect image obtained in imaging step 208, stable high-magnification reference image acquisition is possible by switching the imaging scheme to the conventional high-magnification reference imaging sequence.

Next, the ADC process 217 is executed in accordance with the defect extraction program stored in the defect-extracting functional block 1142 of the program memory 114. In the ADC process 217, a defective region is first extracted (step 218). Next in accordance with a defect classification program stored in a defect-classifying functional block 1143, the high-magnification defect image 308 and the high-magnification reference image (the neighboring high-magnification reference image 307 or an adjacent high-magnification reference image 309) are entered and the automatic defect classification (ADC) discussed earlier herein is executed (step 219) to classify defects into a plurality of categories. The image group 222 acquired during this process (i.e., the secondary electron images and reflected electron images corresponding to the low-magnification defect image, the low-magnification reference image, the high-magnification defect image, and the high-magnification reference image, respectively), is output as output information 220 with classified-defect species information 221. The ADR and ADC process sequence described above is continued until the classification of all defects to be reviewed has been completed (step 223).

Second Embodiment

Figure 5:
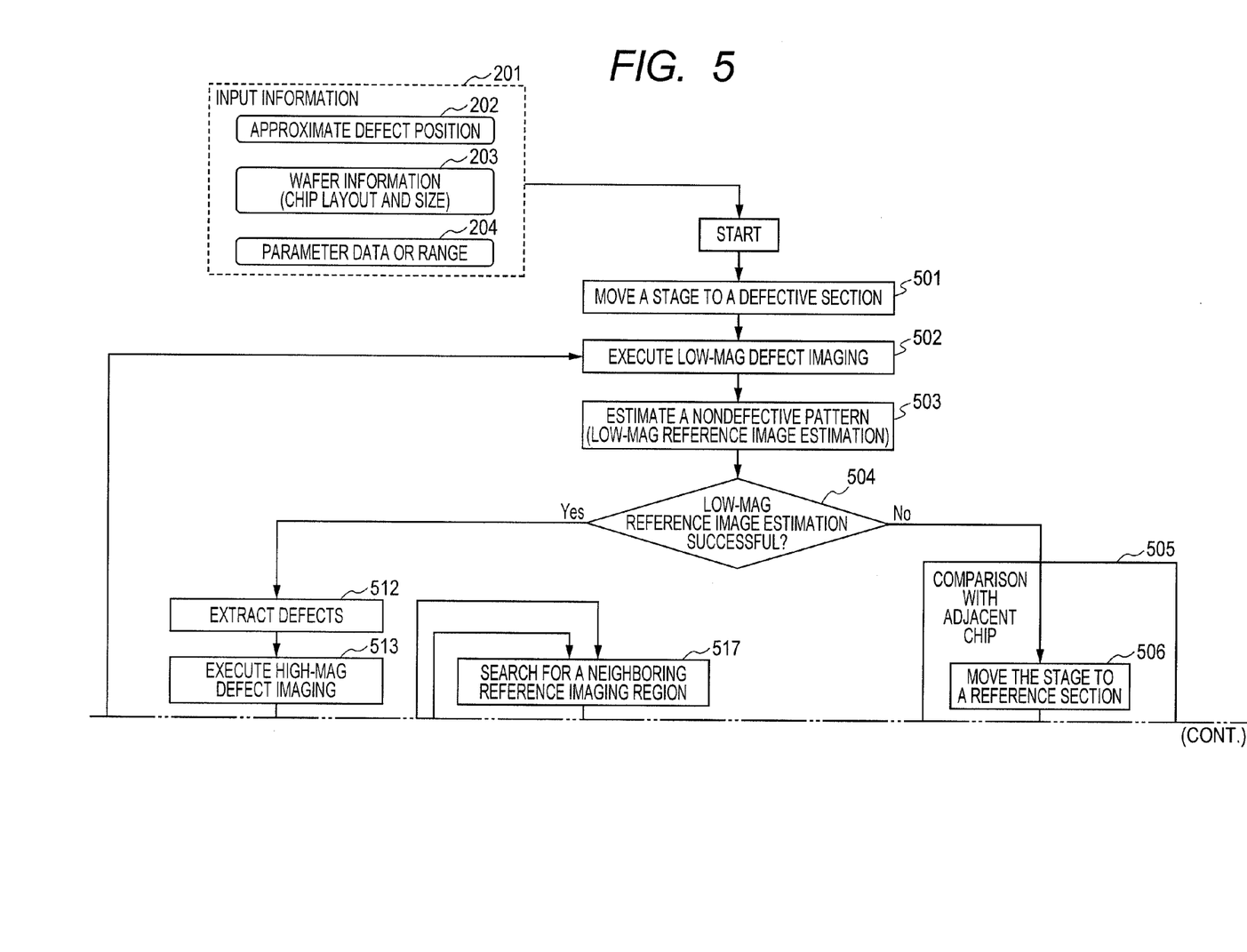
FIG. 5 is a process flow diagram that shows a second embodiment of the ADR process and ADC process using the defect-reviewing apparatus according to the present invention.
Figure 6:
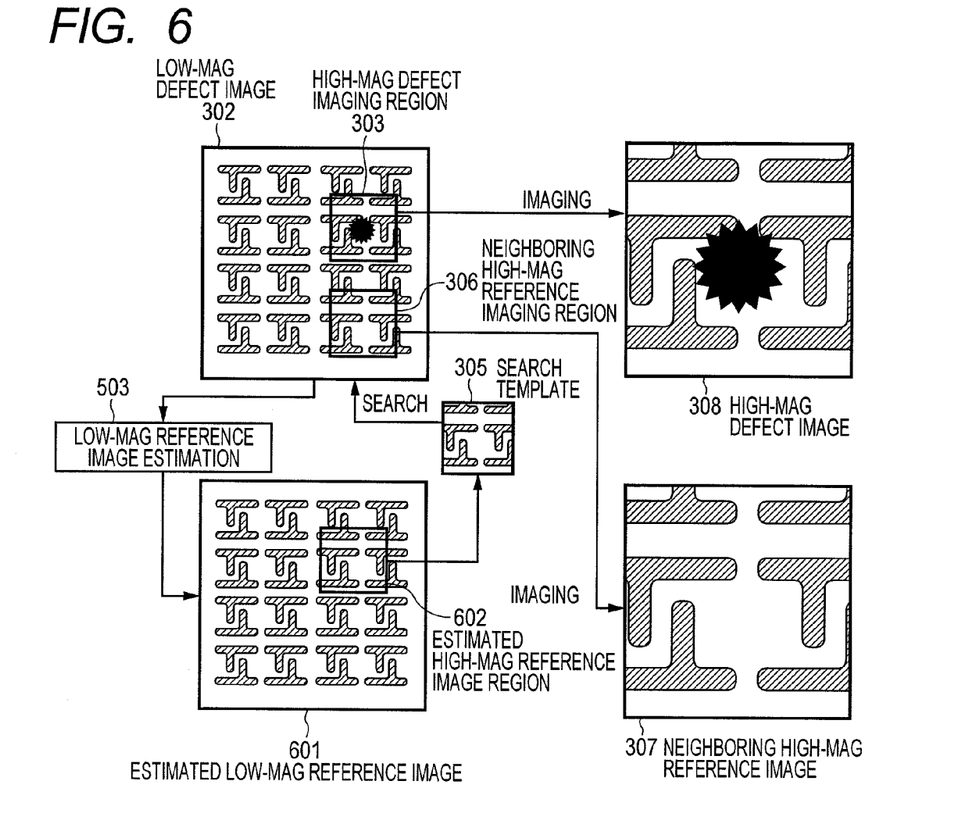
FIG. 6 is an illustrative diagram of the second embodiment of the ADR process and ADC process in the present invention.

A second embodiment of the ADR process and ADC process using the defect-reviewing apparatus according to the present invention is described below. The second embodiment applies to a case of implementing a sequence in which to search for a high-magnification reference imaging region without not only moving the stage from a low-magnification defect imaging position but also acquiring a low-magnification reference image, and image the high-magnification reference imaging region. The sequence inclusive of the ADR and ADC processes in this case is shown in FIG. 5. FIG. 6 schematically shows examples of defect images and reference images obtained in the sequence. In the sequence according to the present invention, since a low-magnification defect image is acquired first, a defect extraction process to be described later herein or a relief process for acquiring a high-magnification reference image in a case of a neighboring high-magnification reference imaging region search being unsuccessful involves first acquiring the low-magnification reference image 301 by moving the stage to an adjacent chip, and then acquiring the adjacent high-magnification reference image 309.

The sequence according to the present invention is detailed below with reference to FIGS. 5 and 6. The sequence according to the present embodiment, as with that described in the first embodiment, assumes that position coordinate information relating to each defect on the wafer 106 are obtained by inspecting the wafer 106 with the defect inspection apparatus (not shown), and a variety of electronic optical parameters for imaging the wafer 106 with the SEM image acquisition unit 118 are already stored in the recipe file of the storage unit 116. In this state, input information 5201 necessary for the ADR and ADC processes is first entered, as in the first embodiment.

Next, the stage 107 is moved so that one of the defects on the sample wafer 106 comes into the imaging field of view of the SEM in accordance with the defect position coordinate information stored in the recipe file of the storage unit 116, the position coordinate information being obtained during the inspection of the wafer with the defect inspection apparatus (not shown) (step 501), and then the low-magnification defect image 302 is acquired (step 502). The acquired low-magnification defect image 302 is stored in the image memory 115. Then, a nondefective-pattern estimation process is conducted upon the low-magnification defect image 302 in accordance with a nondefective-pattern estimating program stored in a nondefective-pattern estimating functional block 1141 (step 503). An estimated low-magnification reference image 601 based on the low-magnification defect image 302 is consequently formed without imaging the wafer 106.

The nondefective-pattern estimation process here is performed by an estimating method that utilizes cyclic periodicity of a circuit pattern of a memory cell or the like. In this method, as described in Patent Document 3, after the period of a cyclic pattern has been calculated from a low-magnification defect image, pixels of a normal pattern obtained by shifting the period with respect to pixels of the low-magnification defect image are overlaid on the pixels of the defect image. Thus, the low-magnification reference image is formed from the low-magnification defect image 302. The process advances to the next step of step 504 for determining whether the nondefective-pattern estimation process has been successful. If the nondefective-pattern estimation process 503 is determined to have been unsuccessful, processing advances to step 505 for defect detection based on comparison with adjacent chips, and acquisition of high-magnification defect images and reference images. In this case, however, since a low-magnification reference image on a chip adjacent to the defective chip has not been acquired, the stage is moved to a reference section of the adjacent chip (step 506) and the low-magnification reference image 301 is acquired (step 507).

Then, differential comparisons between the low-magnification defect image and the low-magnification reference image are executed to extract the adjacent reference image region 304 and the high-magnification defect imaging region 303 (step 508). At this time, the stage is positioned at the reference section, so a high-magnification reference image can be acquired by imaging the adjacent reference image region 304 at a high magnification without stage movement (step 509). Next after stage movement to the defective section (step 510), a high-magnification defect image is acquired (step 511).

The following describes processing that will occur if the low-magnification reference image estimation process (step 503) is successful. First, the estimated low-magnification reference image 601 and low-magnification defect image 302 that have been obtained during the nondefective-pattern estimation process 503 are used as inputs to extract a defect position in accordance with the defect-extracting program in the defect-extracting functional block 1142 of the program memory 114 (step 512). Next, the high-magnification defect imaging region 303 with the defect position as its center is imaged, whereby the high-magnification defect image 308 is acquired (step 513).

After this, whether a high-magnification reference image is to be estimated is determined (step 514). This determination is conducted from various aspects such as whether to use the recipe-specified settings for the particular device product type, manufacturing process, or wafer, and an occupancy rate of the defective region in the high-magnification defect image. If the estimation of a high-magnification reference image is to be executed, the high-magnification reference image is acquired by executing a high-magnification reference image estimation process (step 515) in accordance with the nondefective-pattern estimating program stored in the nondefective-pattern estimating functional block 1141 of the program memory 114. Next, whether the high-magnification reference image estimation has been successful is determined (step 516). If the high-magnification reference image estimation has been successful, the step advances to the ADC process (step 5217).

Neighboring reference imaging region searching step 517 is executed in case the high-magnification reference image estimation is determined to be not executed in the step 514 or executed as a relief process if the high-magnification reference image estimation process 515 has failed. In neighboring reference imaging region searching step 517, first as shown in FIG. 6, the region whose coordinates in the image are the same as those of the high-magnification defect imaging region 303 with respect to the estimated low-magnification reference image 601 is acquired as an estimated high-magnification reference image region 602, then an image of the estimated high-magnification reference image region 602 is extracted, and the extracted image is stored into the image memory 115. Next, the extracted image is defined as the searching template 305, and the pattern-matching program stored in the pattern-matching block 1144 of the program memory 114 is executed using the searching template 305 and low-magnification defect image 302 as inputs. Thus, the neighboring reference imaging region 306 having the pattern most similar to that of the searching template 305, in the low-magnification defect image 302, is searched for as shown in FIG. 6 (step 517).

Next, in conditional adjacent reference image acquisition step 5212, whether it is possible to search the neighboring reference imaging region is determined in a manner similar to that of the above-described first embodiment (step 5213). If the search for the neighboring reference imaging region is determined to be possible in this step, the neighboring high-magnification reference imaging region 306 is imaged (step 5214) and the neighboring high-magnification reference image 307 is acquired. If the search is determined to have failed for such a reason as that a pattern similar to that of the searching template is absent in the low-magnification defect image, the stage is moved to an adjacent chip (step 5215) and then the adjacent reference image region 304 is imaged at a high magnification to acquire the high-magnification reference image 309 (step 5216), the steps 5215 and 5216 being the conventional sequence. In this way, if the search for the neighboring high-magnification reference image has failed (i.e., if the determination result in step 5213 is "No"), stable high-magnification reference image acquisition is possible by switching the imaging scheme to the conventional sequence (steps 5215 and 5216).

Upon the low-magnification defect image 302, low-magnification reference image 301, neighboring high-magnification reference image 306, adjacent high-magnification reference image 304, or estimated high-magnification reference image, and high-magnification defect image 308 being acquired during the above processing, defective region extraction (step 5218) and defect classification (step 5219) are carried out in the ADC process (step 5217), as in the foregoing first embodiment. The acquired images and classification results are output as output information 5220. The ADR and ADC process sequence described above is continued until the classification of all defects to be reviewed has been completed (step 5223).

Third Embodiment

Figure 8:
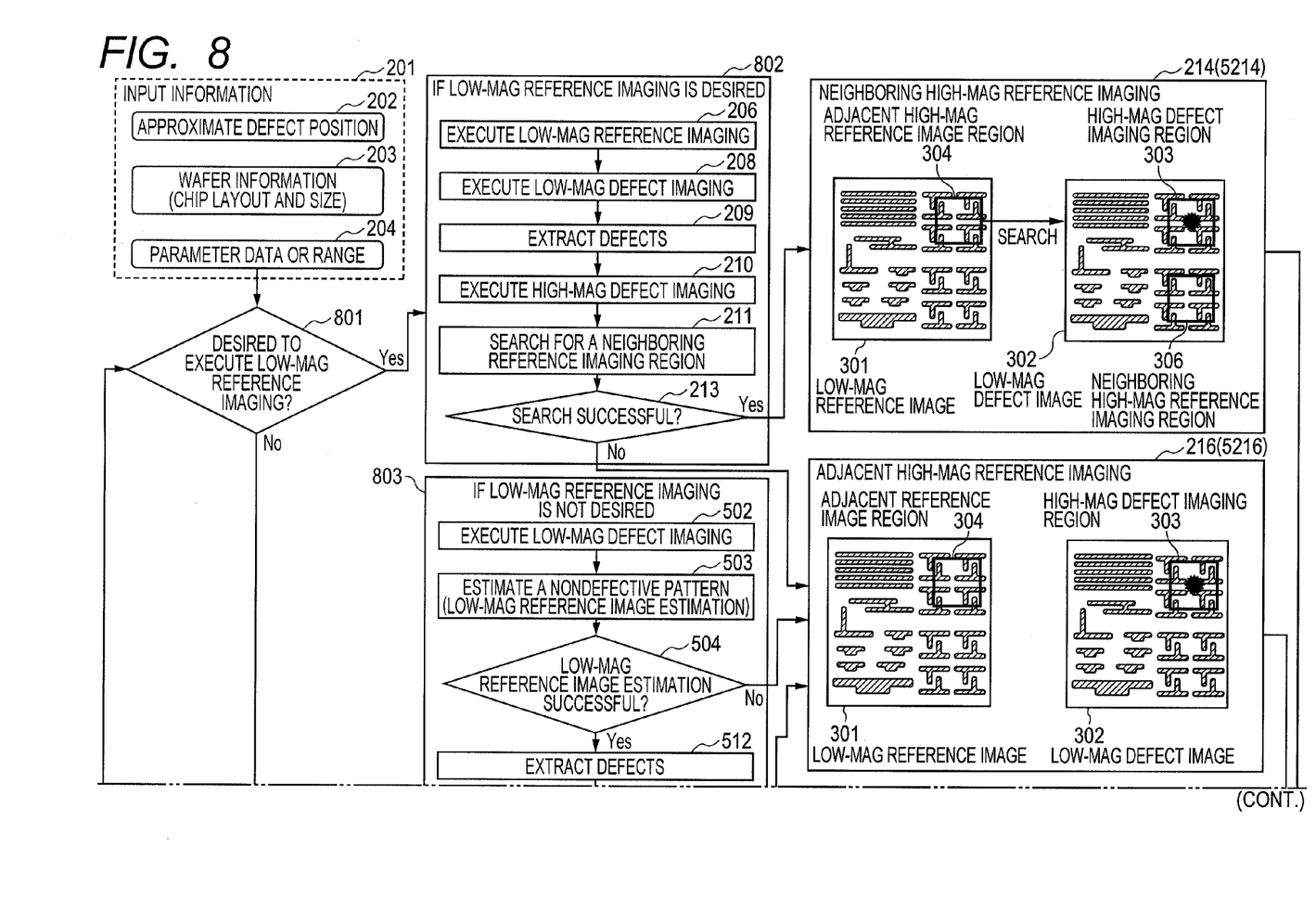
FIG. 8 is a process flow diagram that shows a third embodiment of the ADR process and ADC process using the defect-reviewing apparatus according to the present invention.

A third embodiment of the ADR process and ADC process using the defect-reviewing apparatus according to the present invention is described below. The third embodiment is an example of realizing the switchover between the sequence of the first embodiment and that of the second embodiment, depending on whether a low-magnification reference image is to be acquired. The sequence inclusive of the ADR and ADC processes in this case is shown in FIG. 8.

The sequence according to the present invention is described below with reference to FIG. 8. First, whether a low-magnification reference image is to be acquired for each defect is determined (step 801). Criteria for this determination are manually set in the recipe beforehand for each product type of device such as a memory product or logic product, or for each manufacturing process. If design layout information can be used, one of the two types of sequences is instead selected using approximate defect position coordinates and design layout information.

If low-magnification reference images are to be acquired (step 802), steps 205 to 217 of the sequence in the first embodiment described above with reference to FIG. 2 are executed to conduct the ADR process and the ADC process. If low-magnification reference images are not to be acquired (step 803), steps 5212 and 5217 (equivalent to steps 213 and 217, respectively, in the flow diagram shown in FIG. 2) in addition to steps 501 to 504 of the sequence in the second embodiment described above with reference to FIG. 5 are executed to conduct the ADR process and the ADC process. These process sequences are continued until the classification of all defects to be reviewed has been completed (step 804). In the flow diagram of FIG. 8, the stage-moving steps in the flow diagram of FIG. 2 or 5 (i.e., steps 205, 207, 215 in FIG. 2, and steps 501, 5215 in FIG. 5) are included, but these steps are not described herein.

Figure 9:
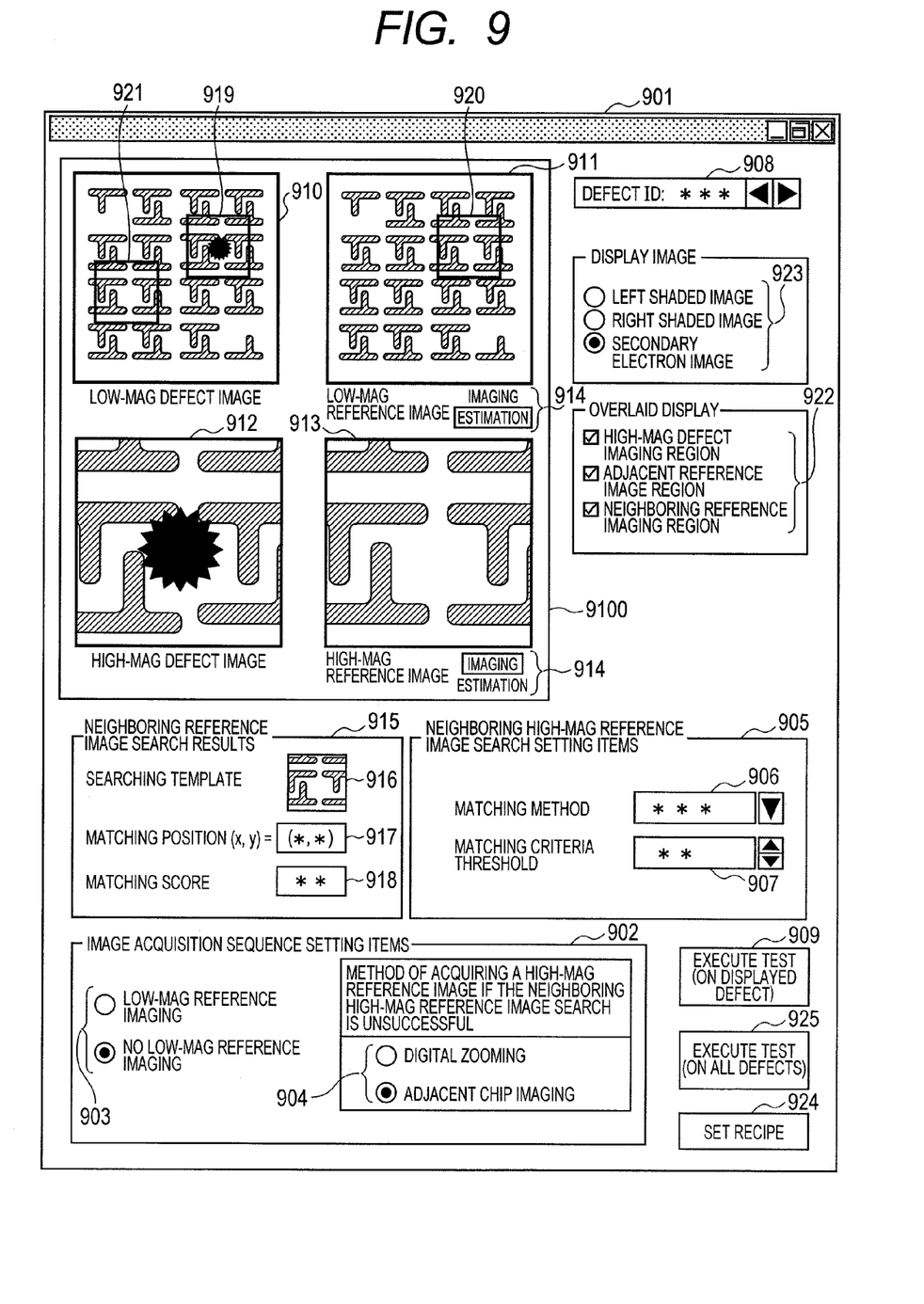
FIG. 9 shows an example of an interface for reviewing a defect image and a reference image according to the present invention.

FIG. 9 shows an example of a GUI used to set up input parameters in this sequence, and the recipe including the sequence, or to display results. As shown in a window 901 of FIG. 9, various information to be described below can be displayed in one screen or in divided form, on a monitor or the like. Asterisks assigned to reference numbers 906, 907, 908, 917, and 918 in FIG. 9, denote any value (or character string) that has been input to or output from a system, and a data range, or an array of values or data ranges.

Setup of input information is described next. An ID of a defect to undergo processing is specified in a box 908. Reference number 902 denotes an image acquisition sequence setup location, wherein whether a low-magnification reference image is to be acquired for each defect is specified using a radio button 903. In addition, whether a reference image is to be acquired from an adjacent chip if the neighboring high-magnification reference image search (step 211 or 517) is unsuccessful, is specified using a radio button 904. In case that high-magnification reference image is not acquired, a low-magnification reference image is enlarged by digital zooming to estimate a high-magnification reference image. Reference number 905 denotes a location where various pattern-matching parameters used in the search for the neighboring high-magnification reference imaging region 306 is set up. In a box 906, one of pattern-matching algorithms provided in advance is selected in a pull-down format. A box 907 is used to specify a threshold level for the pattern-matching score used to determine whether the neighboring high-magnification reference image search (step 211 or 517) has been successful. After entry of input information in steps 902 and 905, when a button 909 is pressed, the ADR and ADC processes for the defect of the ID specified in the box 908 are executed using the above-set sequence and parameters.

A method of displaying output results on the ADR and ADC processes is described below. A low-magnification defect image 910, low-magnification reference image 911, high-magnification defect image 912, and high-magnification reference image 913 that have been acquired during the ADR and ADC processes are displayed in an image display region 9100 of the window 901. For the low-magnification reference image 911 and the high-magnification reference image 913, whether the images were obtained by actual imaging or acquired from the estimation using the nondefective-pattern estimating program stored in the nondefective-pattern estimating functional block 1141 is displayed as information 914. A high-magnification defect imaging region 919 defined by the defect-extracting program stored in the defect-extracting functional block 1142, and an adjacent reference image region 920 are displayed in overlaid form on the low-magnification defect image 910 and the low-magnification reference image 911.

Search results on the neighboring reference image are displayed in a region 915. More specifically, these search results are the searching template image 916 that was used for the execution of the pattern-matching program stored in the pattern-matching block 1144, information on the best matching position 917 obtained as a result of pattern-matching program execution in the pattern-matching block 1144, and a matching score 918 corresponding to the best matching position 917. Additionally, information on the neighboring high-magnification reference imaging region 306 (see FIG. 3) that was detected during the neighboring reference imaging search (step 211 or 517) is displayed in overlaid form on the low-magnification defect image 910 (see 921 in FIG. 9).

Show/hide selection with a check box 922 is possible for the region 920 displayed in overlaid form on the low-magnification reference image 911, as well as for the regions 919, 921 displayed in overlaid form on the low-magnification defect image 910 displayed in the image display region 9100 shown in FIG. 9. The configuration with the SEM image acquisition unit 118 shown in FIG. 1 enables the reviewing SEM in the first to third embodiments to acquire left-shaded and right-shaded images and a secondary electron image, as the images 910 to 913 displayed in the image display region 9100, and display any one of the three images in the region 9100. Which of the acquired images is to be displayed on the GUI can be specified with a radio button 923. While confirming output results on the ADR and ADC processes, the operator adjusts the recipe and upon completion of the recipe adjustment, presses a button 924. The input information in steps 902 and 905 is then saved in the adjusted recipe. In addition, a press of a button 925 enables the ADR and ADC processes for all defects to be carried out with the recipe settings displayed on the GUI, and workmanship of the recipe to be confirmed by checking results of the two processes.

The invention claimed is:

1. A scanning electron microscope (SEM)-aided defect-reviewing apparatus comprising:
   a memory that stores position information on a defect detected in a chip among plural chips formed on a sample, during inspection with an external inspection apparatus;
   a SEM installing a stage on which the sample is mounted and the SEM acquires an image of the sample mounted on the stage by irradiating a surface of the sample with an electron beam that has converged, and scanning over the surface of the sample;
   a processor that processes the image acquired by the SEM; and
   a central processor unit (CPU) that controls the SEM and the processor,
   wherein:
   the CPU controls the SEM to move the stage to acquire a low-magnification reference image of a chip neighboring to the chip in which the defect is detected with the external inspection apparatus, and then move the stage to acquire a low-magnification defect image of the chip in which the defect, which is detected by the external inspection apparatus, is existing, by using the defect position information stored by the memory;

the processor compares the low-magnification reference image with the low-magnification defect image to extract the defect, and acquires position information on the defect;

the CPU further controls the SEM for imaging a high-magnification defect imaging region including the defect on the sample detected with the external inspection apparatus, to acquire a high-magnification defect image;

the processor acquires an adjacent reference imaging region from the low-magnification reference image having the same in-chip coordinate as that of the high-magnification defect imaging region, and extracts a neighboring high-magnification reference imagining region having a pattern with similarity to that of the adjacent reference imagine region;

the CPU further controls the SEM for imaging the neighboring high-magnification reference imaging region, and in case that there is no neighboring high-magnification reference imaging region having a patter with similarity to that of the adjacent reference imaging region, the CPU controls the SEM to move the stage to a position for taking the low-magnification reference image of the neighboring chip and acquires a high-magnification reference image from the adjacent reference imaging region; and the processor further compares the acquired high-magnification defect image and the image of the neighboring high-magnification reference imaging region or the high-magnification reference image acquired from the adjacent reference imaging region, and extracts a high-magnification defect image.

2. The SEM-aided defect-reviewing apparatus according to claim 1,
wherein: when the processor searches for the high-magnification reference image acquisition region from the acquired low-magnification image of the region including the defects, the processor first creates a searching template by extracting the same coordinate region as that of the high-magnification image of the defect-inclusive region, in one of a plurality of chips formed with a pattern originally of the same shape on the sample, the chip being adjacent to that on which the high-magnification image of the defect-inclusive region was acquired, from an adjacent low-magnification image obtained by the low-magnification imaging, and then uses the created searching template to search for an acquisition zone of the high-magnification reference image, from the defect-inclusive low-magnification image, by pattern matching.

3. The SEM-aided defect-reviewing apparatus according to claim 1,
wherein: the processor determines whether the low-magnification reference image can be estimated from a low-magnification defect image obtained by the low-magnification imaging of the region inclusive of the defects on the sample by use of the scanning electron microscope (SEM), and if the estimation is determined to be possible, creates the low-magnification reference image from the low-magnification image of the defect-inclusive region.

4. The SEM-aided defect-reviewing apparatus according to claim 1,
wherein: the processor determines whether the low-magnification reference image can be estimated from a low-magnification defect image obtained by the low-magnification imaging of the region inclusive of the defects on the sample by use of the scanning electron microscope (SEM); and
if the estimation is determined to be impossible, the CPU controls the scanning electron microscope (SEM) so that the same coordinate region as that of the defect-inclusive region, in one of a plurality of chips formed with a pattern originally of the same shape on the sample, the chip being adjacent to that on which the image of the defect-inclusive region was acquired, is imaged at the low magnification, and then the low-magnification reference image is acquired.

5. A scanning electron microscope (SEM)-aided method of reviewing a defect on a sample, the method comprising:
obtaining position information on a defect detected in a chip among plural chips formed on a sample, during inspection with an external inspection apparatus;
using a scanning electron microscope (SEM) installing a stage on which the sample is mounted, acquiring a low-magnification reference image of a chip neighboring to the chip in which the defect is detected with the external inspection apparatus, and then moving the stage to acquire a low-magnification defect image of the chip in which the defect, which is detected by the external inspection apparatus, by using the obtained position information on the defect detected on the sample;
comparing the acquired low-magnification image of the region including the defect with the low-magnification reference image, then extracting the defect, and acquiring position information on the defect;
using the SEM to image the defect-inclusive region at a high magnification on the basis of the acquired defect position information;
acquiring an adjacent reference imaging region from the low-magnification reference image having the same in-chip coordinate as that of the high-magnification defect imaging region, and extracting a neighboring high-magnification reference imaging region having a pattern with similarity to that of the adjacent reference imaging region;
using the SEM to image the neighboring high-magnification reference imaging region, and in case that there is no neighboring high-magnification reference imaging region having a pattern with similarity to that of the adjacent reference imaging region, moving the stage to a position for taking the low-magnification reference image of the neighboring chip and acquiring a high-magnification reference image from the adjacent reference imaging region; and
comparing the acquired high-magnification defect image and the image of the neighboring high-magnification reference imaging region or the high-magnification reference image acquired from the adjacent reference imaging region, and extracting a high-magnification defect image.

6. The SEM-aided method of reviewing defects according to claim 5,
wherein: a plurality of chips each with a pattern originally of the same shape, are formed on the sample; and when an acquisition region of the high-magnification reference image is searched from the acquired low-magnification image of the region including the defects, an internal region of an adjacent chip whose internal coordinates are the same as those of the acquired high-magnification image of the defect-inclusive region is extracted from an adjacent low-magnification image obtained by the low-magnification imaging to create a searching template, and the created searching plate is used to search for an acquisition zone of the high-magnification reference image, from the defect-inclusive low-magnification image, by pattern matching.

7. The SEM-aided method of reviewing defects according to claim 5, comprising:
determining whether the low-magnification reference image can be estimated from a low-magnification defect image obtained by the low-magnification imaging of the region inclusive of the defects on the sample, by use of the scanning electron microscope (SEM); and
if the estimation is determined to be possible, the low-magnification reference image is created from the acquired low-magnification image of the defect-inclusive region.

8. The SEM-aided method of reviewing defects according to claim 5, comprising:
determining whether the low-magnification reference image can be estimated from a low-magnification defect image obtained by the low-magnification imaging of the region inclusive of the defects on the sample, by use of the scanning electron microscope (SEM); and
if the estimation is determined to be impossible, the same coordinate region as that of the defect-inclusive region, in one of a plurality of chips formed with a pattern originally of the same shape on the sample, the chip being adjacent to that on which the image of the defect-inclusive region was acquired, is imaged at the low magnification, and then the low-magnification reference image is acquired.

* * * * *